Figure 1:
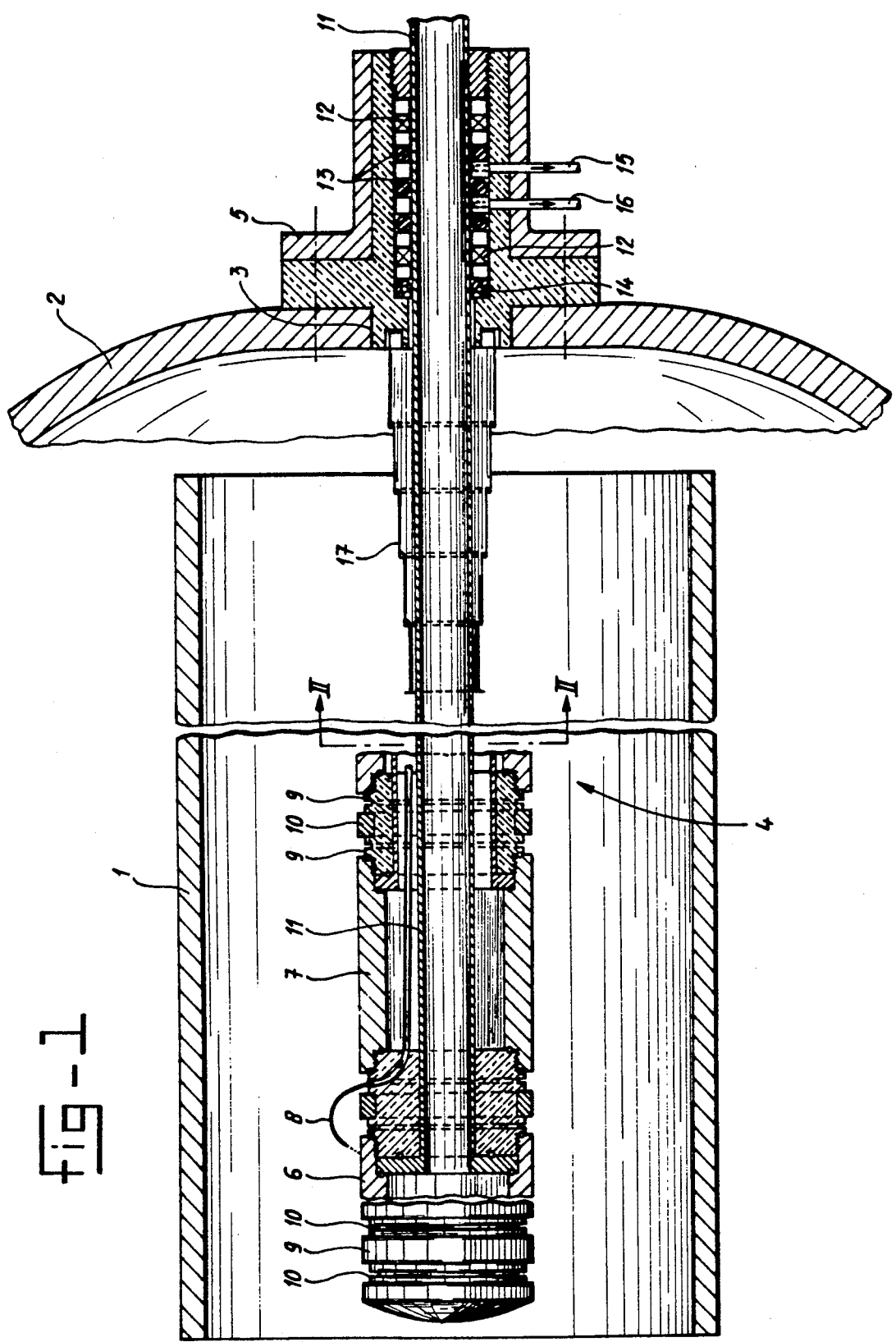

United States Patent [19]
Wesemeyer et al.

[11] Patent Number: 5,026,466
[45] Date of Patent: Jun. 25, 1991

[54] METHOD AND DEVICE FOR COATING CAVITIES OF OBJECTS

[75] Inventors: Harald Wesemeyer, Wiehl, Fed. Rep. of Germany; Hans Veltrop, Grubbenvorst, Netherlands

[73] Assignee: Hauzer Holding B.V., Venlo, Netherlands

[21] Appl. No.: 492,252

[22] Filed: Mar. 9, 1990

Related U.S. Application Data

[63] Continuation of Ser. No. 212,495, Jun. 28, 1988, abandoned.

[30] Foreign Application Priority Data

Jun. 29, 1987 [EP] European Pat. Off. ........ 87201244.8

[51] Int. Cl.⁵ .......................... C23C 14/32; B05D 3/06
[52] U.S. Cl. ............................ 204/192.38; 204/298.41; 427/37; 118/723
[58] Field of Search ...................... 204/192.38, 298.41; 427/35, 37; 118/723

[56] References Cited

U.S. PATENT DOCUMENTS

| 3,491,015 | 1/1970 | Naff ................................. 204/298 |
| 3,783,231 | 1/1974 | Sablev et al. ................... 204/298 D |
| 3,793,179 | 2/1974 | Sablen et al. ........................ 204/298 |
| 4,468,309 | 8/1984 | White ............................... 204/192 N |
| 4,492,845 | 1/1985 | Kljuchko et al. .............. 204/298 D |
| 4,505,947 | 3/1985 | Vukanovic et al. ............ 204/298 D |
| 4,673,477 | 6/1987 | Ramalingam et al. ......... 204/298.41 |
| 4,724,058 | 2/1988 | Morrison, Jr. ................... 204/298 D |

FOREIGN PATENT DOCUMENTS

| 0099724 | 2/1984 | European Pat. Off. . |
| 2820301 | 11/1979 | Fed. Rep. of Germany . |
| 3150591 | 10/1982 | Fed. Rep. of Germany . |
| 711787 | 6/1978 | U.S.S.R. .................. 204/192.3 B |
| 1482219 | 8/1977 | United Kingdom . |
| 2139648 | 11/1984 | United Kingdom . |

OTHER PUBLICATIONS

Patent Abstracts of Japan, vol. 1, JP-A-52 38 484.
Patent Abstracts of Japan, vol. 10, JP-A-60 255 96 & JP-A-60 187 669.
Patent Abstract of Japan, vol. 5, JP-A-56 75 569.
Patent Abstracts of Japan, vol. 1, Ser. No. 50-114503.

Primary Examiner—Nam X. Nguyen
Attorney, Agent, or Firm—Harness, Dickey & Pierce

[57] ABSTRACT

Method and device for coating cavities of objects such as the internal surface of tubes with the cathode arc deposition method. This method is used such that material from the cathode surface migrates and is deposited on the surface of said cavity. To this end the cathode is introduced into the cavity. The device for performing the above method comprises at least a cathode arc deposition device. The object to be coated can be connected as anode although it is also possible that a separate anode is provided in which case a voltage is applied to the object being negative with regard to the voltage applied to the cathode.

20 Claims, 4 Drawing Sheets

METHOD AND DEVICE FOR COATING CAVITIES OF OBJECTS

This is a continuation of patent application Ser. No. 212,495, filed June 28, 1988, now abandoned.

This invention relates to a method for coating cavities of objects, such as the internal surface of tubes.

Such method is generally known in prior art. This method comprises PVD (Physical Vapor Deposition) techniques, such as cathode sputtering (DE-A-3.150.591 and DE-A-2.820.301), evaporizing of electrically conducting material (GB-A-1.482.219 and JP-A-60-187.669). These techniques all have as draw back that adhering of the coating being deposited on the internal surface is not sufficient and the obtainable thickness of the coating is too small, and not even enough for many applications.

The invention aims to obviate this draw back and to provide a method with which it is possible to obtain a coating which ensures a much improved adhering force and even thickness of the material to be deposited to the object to be coated.

This aim is realized with a method as described above, in that the cathodic arc deposition method is applied such that the material of the cathode surface migrates and is deposited on the surface of said cavity. During operation of the cathodic arc deposition process the arc spot of the arc directly migrates the cathode material. This is in contrast to techniques wherein the cathode arc only functions to heat material indirectly, said material being evaporized by this heat. Because of the different physical principles the particles migrating from the cathode surface and evaporized particles resp., are in a physically different state which is the reason that by the cathodic arc deposition method a superior surface coating is obtained.

Using the cathodic arc deposition method, objects can be coated wherein the adherence between the material to be deposited and the base material is much improved.

According to preferred embodiment of this method the cathode arc depositing device, which is used with this method, and the cavity to be coated, are moved relatively to each other. This method can be used in combination with a controlled arc, if this is desired. In this way uniform coating of the cavities is ensured on the one hand and the cathode surface is used up in a uniform way on the other hand. In a very simple embodiment the object can be connected as anode. This means that between the object and the cathode an arc is directed, in that the positive tail of the arc goes to the object.

Subject invention also relates to a device for performing the method as described above. This device comprises a (part of a) cathode arc deposition device to be introduced in the cavity to be coated, as well as means for providing a vacuum in said cavities. To keep the spacing from the cathode surface to the wall of the cavity to be coated constant, centering means can be provided. By shaping the cathode surface substantially the same as the cavity to be coated (of course on a smaller scale), a further condition for uniformly coating said cavities is provided. Furthermore means can be arranged for controlling the path of the arc on the cathode surface. For this means reference is made to NL-A-8700620 and 8700621.

According to a further embodiment the cathode-anode arc deposition device comprises an elongate body on which joiningly a cathode and anode surface are provided. The cathode surface can be delimited by arc delimiting means. This is important in the case in which no arc controlling means are provided.

Figure 2:
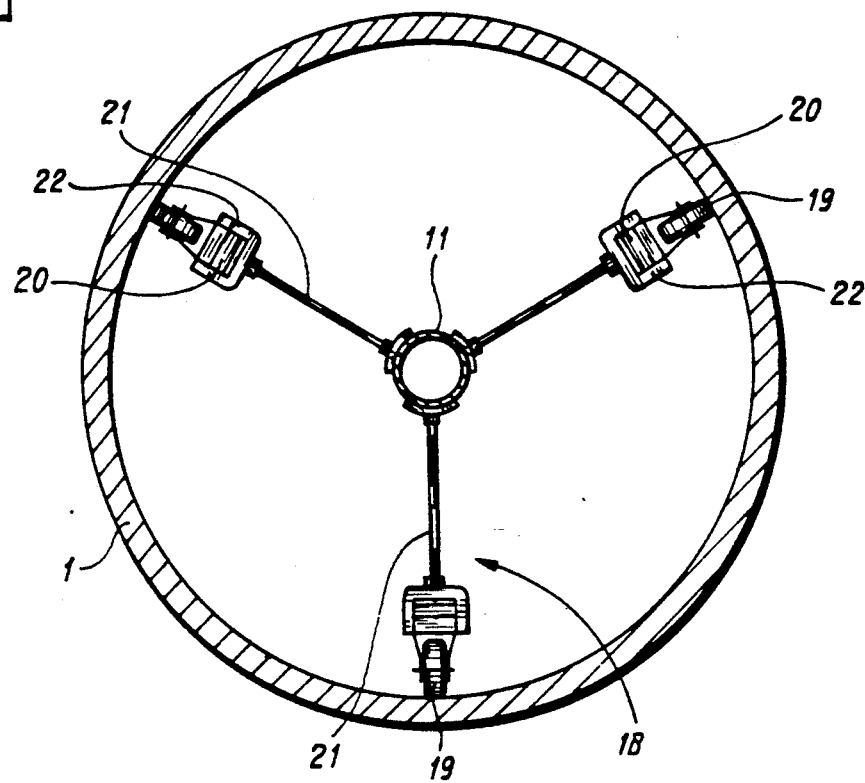
Figure 4:
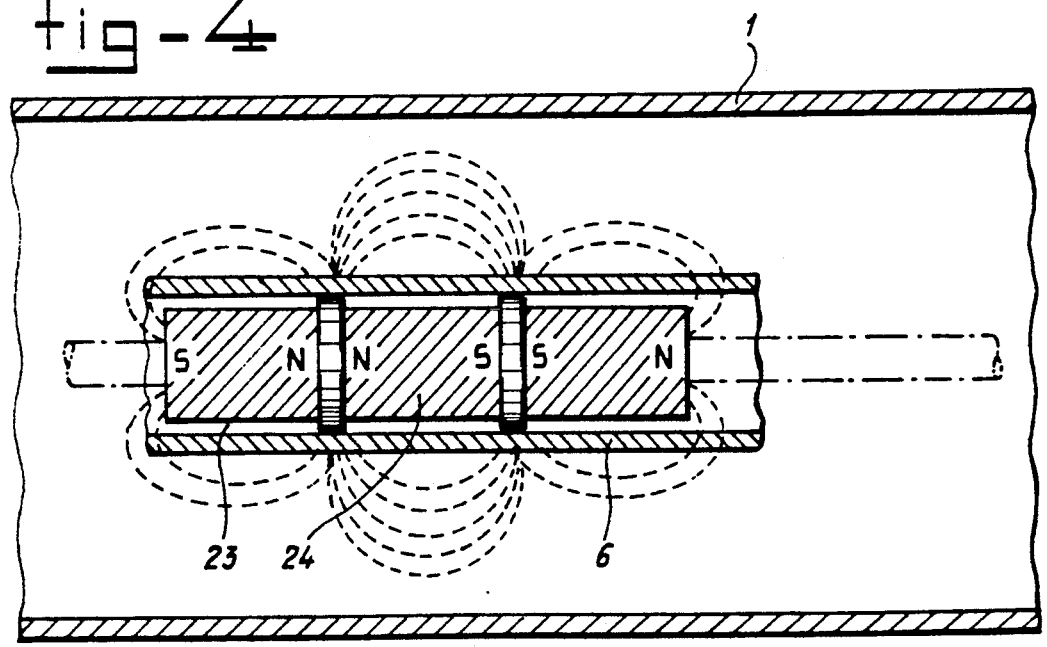
Figure 3:
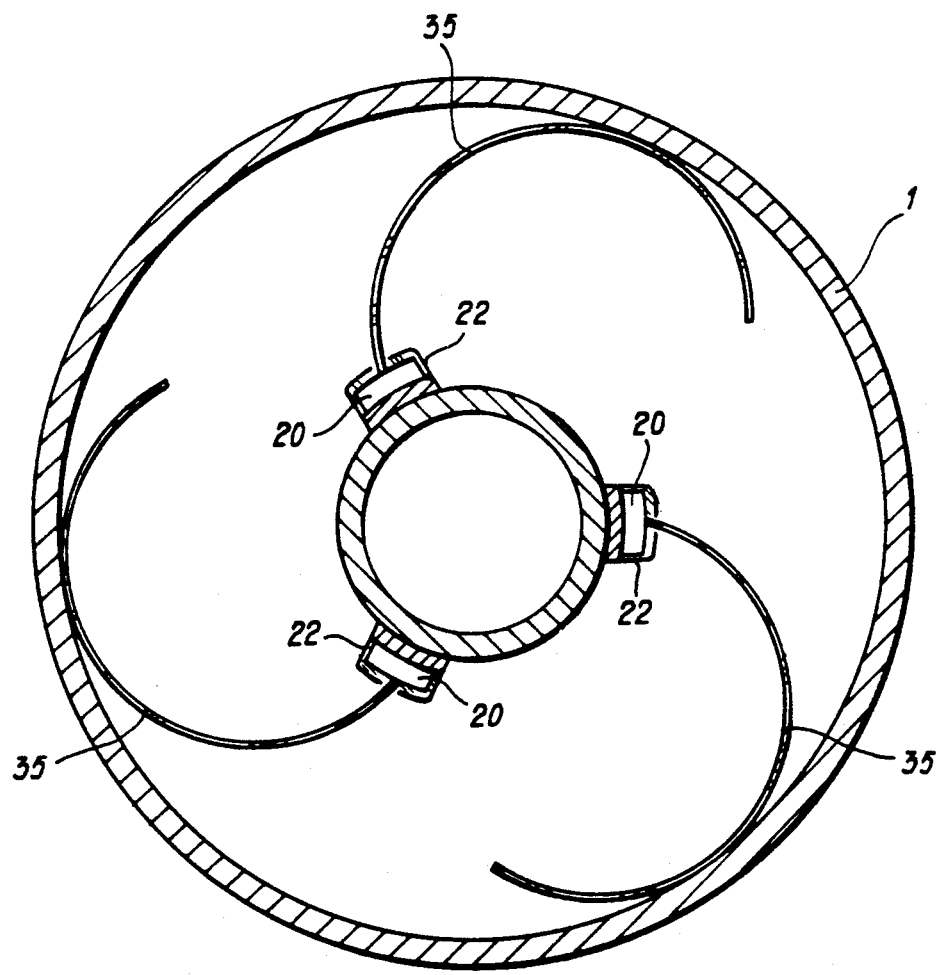
Figure 5:
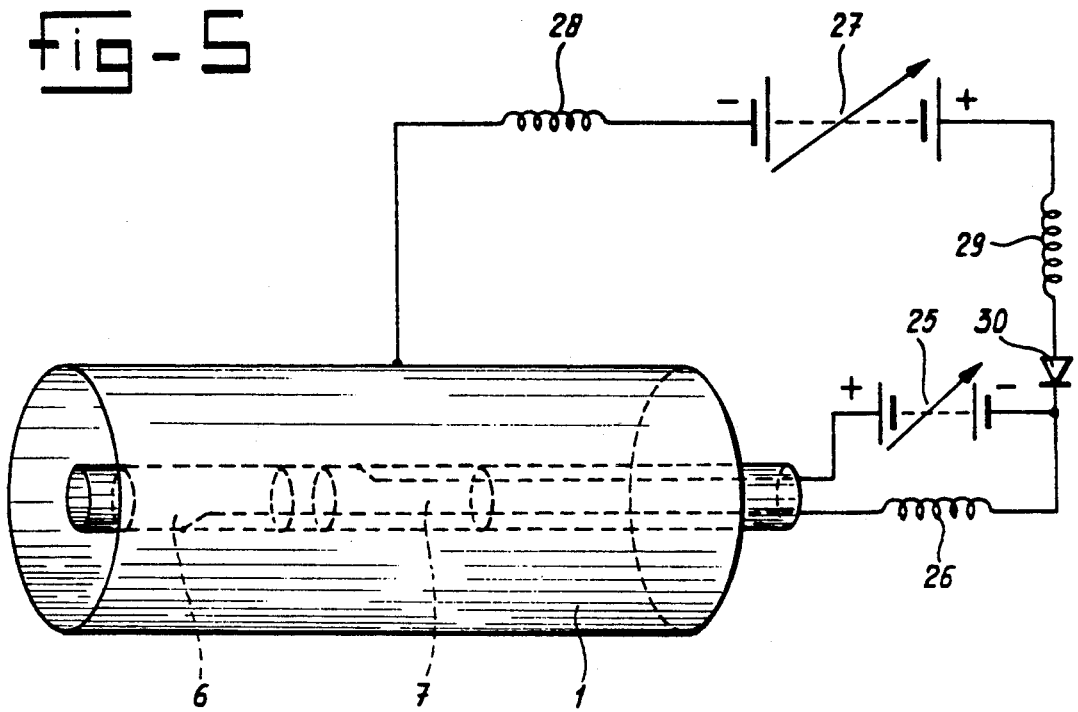
Figure 6:
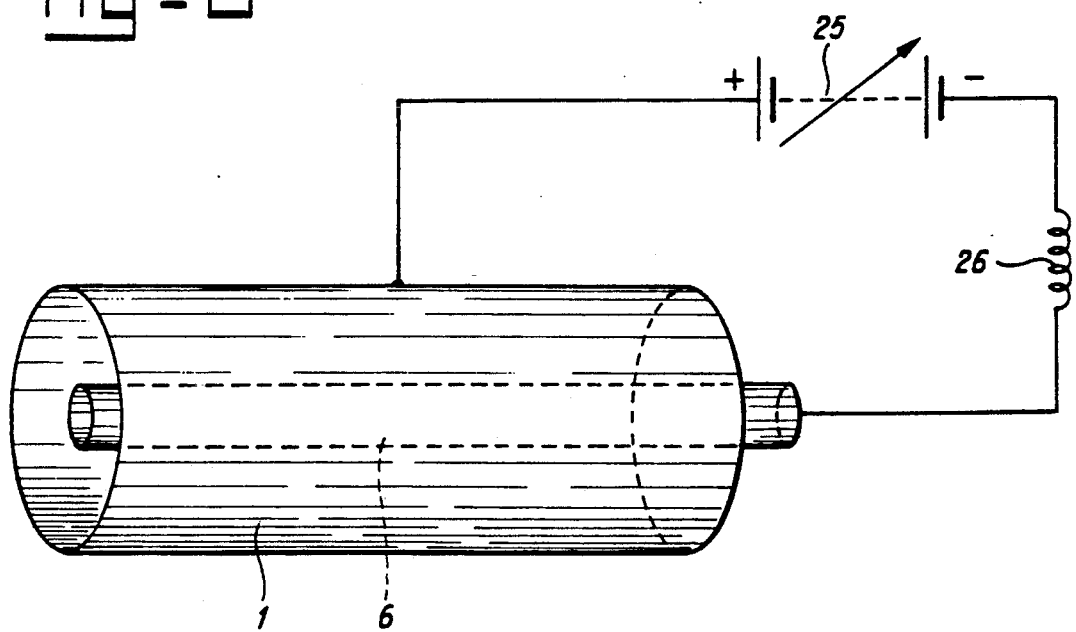

The invention will be described in the following with reference to preferred embodiments being shown in the figures and only given as example. In the drawing shows:

FIG. 1 a side elevation in cross section of a cathode arc deposition device arranged in a tube to be coated;

FIG. 2 cross sectional view II—II of FIG. 1;

FIG. 3 a view similar to FIG. 2 of a further embodiment,

FIG. 4 a detail of the cathode of FIG. 1 in cross section being provided with an arc controlling device;

FIG. 5 schematically the electric circuit used with the cathode arc deposition device in which the article to be coated is connected as anode; and FIG. 6 the circuitry according to FIG. 5 in which the article to be coated does not form cathode or anode.

In FIG. 1 the tube to be coated is referred to with 1. This tube is arranged in vessel 2, which is only partly shown. In this vessel 2, an opening 3 is provided, through which the cathode arc vaporizing device, generally indicated with 4, can be introduced. With flange 5 this device 4 can be sealingly connected to vessel 2. Vessel 2 is a vacuum vessel. As shown the cathode arc deposition device is introduced in tube 1. This cathode arc deposition device comprises cathode 6 and an anode 7. Furthermore an ignition wire 8 is provided near the cathode surface. This wire is connected with a high voltage source (not shown). For further details relating to the circuitry reference is made to NL-A-8601824. Between cathode 6 and anode 7 a ring 9 of magnetic soft material is arranged. This ring 9 is delimited on both sides by a labyrinth structure 10. This structure 10 comprises a number of dark spaces being connected in series. The assembly of ring 9 and labyrinth 10 prevents during operation of the device, the arc extinguishing, or wandering from the cathode respectively. Cathode 6 and anode 7 can also be provided with cooling systems, not shown. For moving the cathode relative to the tube, the cathode 9 is arranged on a movable rod 11.

Through an assembly of ball bearings 12 and seals 13, combined with a sleeve 14 for stopping dirt entering, a stable guiding for rod 11 is provided, sealing as well as possible. For limiting the effects of possible leaks to the vacuum two connections 15 and 16 are provided, wherein the connection 15 is connected with a vacuum prepump and connection 16 is connected with a high vacuum pump. To prevent coating of the part of the rod 11 being within the vacuum vessel 2, this is provided with a telescoping shielding structure 17.

The device as described above operates as follows:

After introducing the tube 1, which has to be coated internally and after arranging the cathode arc depositing device, vessel 2 is evacuated. If the vacuum is sufficient an arc is ignited between anode 7 and cathode 6 by ignition wire 8. This arc runs along the cathode surface and in the cathodic surface material migrates to the surface of the tube to be coated. This arc is in the embodiment shown in FIGS. 1 and 2, uncontrolled. Referring to FIG. 3 an embodiment will be described wherein the path of the arc is controlled. By moving rod 11 to and from all of the internal surface of the tube to be coated can be provided with a layer of material.

To prevent the rod 11 from bending, a centering device is provided, generally referred to as 18. For details reference is made to FIG. 2. From this figure is it clear that this device comprises three rollers 19, being connected with rod 11 through isolating members 20 and legs 21 provided with springs. It is also possible to arrange this device 19 more nearly to the cathode and in this case shieldings 22 can provide a dark space. It is also imaginable to secure the cathode arc deposition device outwardly on both sides of the tube and move it to and from between its mounting points.

In FIG. 3 a more simple embodiment of the device according to FIG. 2 is shown. Instead of rollers 19 resilient arms 35 are used. A combination of a centering effect and adaption to the inside diameter of the tube to be coated is obtained by this matter.

In FIG. 4 a detail of FIG. 1 is shown, being the part near cathode 6. In contrast to FIG. 1 a permanent magnet assembly generally referred to with 23, is arranged. Magnetic field lines are schematically shown. In this embodiment at the spot of the central magnet 24 narrow arc path is formed extending around the cathode surface 6. By moving this assembly 23 within the cathode, the surface of the cathode can be uniformly used. If only one permanent magnet is used instead of three as shown, the field lines of this magnet will have a more flattened shape, by which a wider path of the arc will result. It has to be understood that instead of a permanent magnet assembly 23 an electric coil device can be used, by which only by controlling different coils arc control can be obtained without having to rely on movable parts. For this reference is made to NL-A-8700619.

In FIG. 5 schematically a circuitry is shown in which the tube 1 is connected as anode. The cathode 6 comprises an elongated tube which can be inserted in tube 1. Power is provided by source 25 and a coil 26 is connected in series for increasing the voltage when the arc between the anode and cathode extinguishes by which ignition is possible. In tube 6 means for controlling the arc, as described above, can be provided.

Finally in FIG. 6 a circuitry is shown in which the tube 1 is not connected as anode. This embodiment is preferable when one desires to obtain a further improved adherence between the material to be deposited and the tube to be coated because not only atoms but also ions are deposited. This advantage is accompanied by the more complicated embodiment shown in FIG. 5 with regard to the embodiment shown in FIG. 4. In FIG. 5, also a source 27 is shown for applying a negative voltage of, for instance, 1000 V on tube 1. Coils 28 and 29 are stabilizing coils which smoothen the arc currents by working as negative feedbacks. Diode 30 has a safety function.

Although the embodiments described above with reference to the drawing are preferred embodiments, it has to be understood that to this embodiments all changes being within the reach of the man skilled in the art can be made without leaving from the scope protection of subject invention.

We claim:

1. A cathode arc deposition apparatus for coating an internal surface of a hollow body comprising: a shaft; a tubular cathode terminal having a cathode surface containing a deposition material for coating said internal surface of said hollow body, and having a cathode bore through said cathode terminal for receiving the longitudinal axis of said shaft; an anode terminal mounted about the longitudinal axis of said shaft; ignition means for igniting an arc between said cathode and anode terminals; magnet means, within said cathode bore, for controlling a shape and path of said arc by controllably moving a magnetic field with respect to said cathode surface; and said cathode and anode terminals having external dimensions such that said terminals are capable of being positioned within said hollow body without contacting said hollow body while said internal surface is being coated.

2. The apparatus of claim 1 further comprising a shaft mounting means for movably positioning said cathode and anode terminals within said hollow body such that said cathode terminal is capable of movement therein relative to said hollow body and said shaft mounting means.

3. The apparatus of claim 2 further comprising an evacuation chamber substantially enclosing said cathode and anode terminals and capable of enclosing said hollow body being coated.

4. The apparatus of claim 3 wherein said shaft mounting means is fixably attached to said evacuation chamber.

5. The apparatus of claim 1 wherein said anode terminal is mounted about the longitudinal axis of said shaft by means of an anode bore provided through said anode terminal.

6. The apparatus of claim 1 further comprising a spacer means mounted about the longitudinal axis of said shaft between said cathode and said anode terminals to spatially separate said terminals along the longitudinal axis of said shaft.

7. The apparatus of claim 1 wherein said magnet means is a permanent magnet.

8. The apparatus of claim 1 wherein said magnet means is an electromagnet.

9. The apparatus of claim 1 further comprising an evacuation chamber substantially enclosing said cathode and anode terminals and capable of enclosing said hollow body being coated.

10. The apparatus of claim 11 further comprising a centering means mounted about the longitudinal axis of said shaft for positioning said cathode and anode terminals substantially along the longitudinal axis of said hollow body.

11. A cathode arc deposition apparatus for coating an internal surface of a hollow body comprising: a shaft; a tubular cathode terminal having a cathode surface containing a deposition material for coating said internal surface of said hollow body, and having a cathode bore through said cathode terminal for receiving the longitudinal axis of said shaft; an anode terminal connected to said hollow body; ignition means for igniting an arc between said cathode and anode terminals; magnet means, within said cathode bore, for controlling a shape and path of said arc by controllably moving a magnetic field with respect to said cathode surface; and said cathode terminal having external dimensions such that said cathode terminal is capable of being positioned within said hollow body without contacting said hollow body while said internal surface is being coated.

12. A cathode arc deposition process for coating an internal surface of a hollow body comprising: mounting a tubular cathode terminal onto a shaft, said tubular cathode terminal having a cathode surface containing a deposition material and having a cathode bore therethrough; positioning said cathode terminal within said hollow body without contacting said hollow body; evacuating said hollow body to provide an evacuated space between said cathode terminal and said hollow body; igniting an arc in said evacuated space between said cathode terminal and an anode terminal proximal said cathode terminal causing said deposition material to migrate from said cathode surface to said internal surface of said hollow body thereby coating said internal surface; and controllably moving a magnetic field to control the shape and path of said arc.

13. The process of claim 12 further comprising repositioning said cathode terminal at least once within said hollow body without contacting said hollow body to uniformly coat said internal surface.

14. The process of claim 13 wherein said anode terminal is mounted about the longitudinal axis of said shaft.

15. The process of claim 14 wherein said anode terminal is repositioned at least once within said hollow body without contacting said hollow body and in synchrony with said cathode terminal.

16. The process of claim 12 wherein said anode terminal is mounted about the longitudinal axis of said shaft.

17. The process of claim 16 wherein said cathode and anode terminals are spatially separated along the longitudinal axis of said shaft by a spacer means.

18. The process of claim 12 wherein said hollow body is evacuated by enclosing said hollow body in an evacuation chamber.

19. The process of claim 12 wherein said anode terminal is connected to said hollow body.

20. The process of claim 19 further comprising applying a negative voltage to said hollow body.

* * * * *

UNITED STATES PATENT AND TRADEMARK OFFICE
CERTIFICATE OF CORRECTION

PATENT NO. : 5,026,466

DATED : June 25, 1991

INVENTOR(S) : Wesemeyer, et. al.

It is certified that error appears in the above-identified patent and that said Letters Patent is hereby corrected as shown below:

On the Title page under "U.S. Patent Documents" reference 3,793,179,

"Sablen et al" should be --Sablev et al--.

Column 4, line 40, Claim 10, "11" should be --1--.

Signed and Sealed this

Twenty-third Day of March, 1993

*Attest:*

STEPHEN G. KUNIN

*Attesting Officer*     *Acting Commissioner of Patents and Trademarks*